United States Patent
Fujii et al.

(10) Patent No.: US 8,342,659 B2
(45) Date of Patent: Jan. 1, 2013

(54) LIQUID DISCHARGE HEAD AND METHOD FOR MANUFACTURING THE SAME

(75) Inventors: Kenji Fujii, Hiratsuka (JP); Kazuhiro Asai, Kawasaki (JP); Makoto Watanabe, Yokohama (JP); Yoshinori Tagawa, Yokohama (JP); Yoshiyuki Imanaka, Kawasaki (JP); Yuuji Tamaru, Yokohama (JP); Kousuke Kubo, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 186 days.

(21) Appl. No.: 12/851,704

(22) Filed: Aug. 6, 2010

(65) Prior Publication Data

US 2011/0050828 A1  Mar. 3, 2011

(30) Foreign Application Priority Data

Aug. 25, 2009  (JP) ................. 2009-194455

(51) Int. Cl.
*B41J 2/05* (2006.01)
*B41J 2/00* (2006.01)
(52) U.S. Cl. .............. 347/67; 347/65; 347/110
(58) Field of Classification Search .......... None
See application file for complete search history.

(56) References Cited

U.S. PATENT DOCUMENTS

| | | | |
|---|---|---|---|
| 7,171,748 B2 * | 2/2007 | Kigami et al. | 29/890.1 |
| 7,364,284 B2 | 4/2008 | Hatsui et al. | |
| 2005/0062812 A1 | 3/2005 | Amemiya | |
| 2006/0283961 A1 * | 12/2006 | Misawa et al. | 235/492 |
| 2009/0014413 A1 * | 1/2009 | Nystrom et al. | 216/27 |

FOREIGN PATENT DOCUMENTS

| | | |
|---|---|---|
| EP | 1293343 A2 | 3/2003 |
| EP | 1477316 A1 | 11/2004 |
| EP | 1844938 A1 | 10/2007 |
| FR | 2906646 A1 | 4/2008 |
| JP | 5-74748 A | 3/1993 |
| JP | 2005-181560 A | 7/2005 |
| JP | 2006-082329 A | 3/2006 |

OTHER PUBLICATIONS

Search Report in European Application No. 100008808.7 dated Dec. 3, 2010.
English translation of Japanese Laid-open Patent Application No. 5-74748.

* cited by examiner

*Primary Examiner* — Geoffrey Mruk
*Assistant Examiner* — Bradley Thies
(74) *Attorney, Agent, or Firm* — Fitzpatrick, Cella, Harper & Scinto

(57) ABSTRACT

A liquid discharge head includes a substrate and a flow path wall member provided on the substrate and having a wall defining a flow path connected to a discharge port for discharging liquid. The flow path wall member is provided with a cavity not connected to the flow path, when viewed in a direction from the discharge port toward the substrate, the cavity has a shape of a character, and the character corresponds to information regarding the liquid discharge head.

13 Claims, 6 Drawing Sheets

FIG. 2
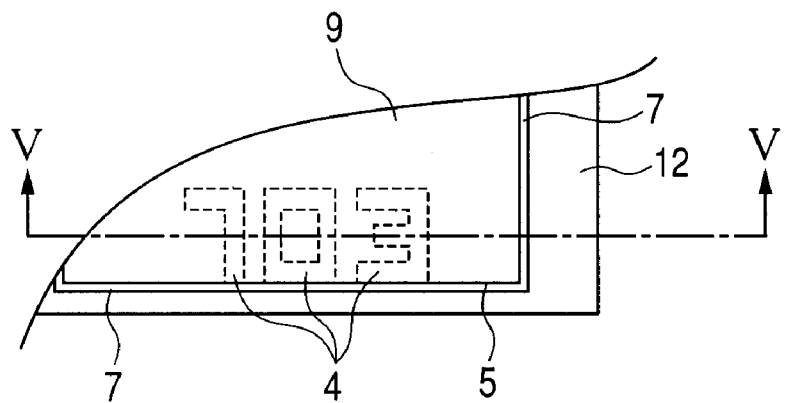
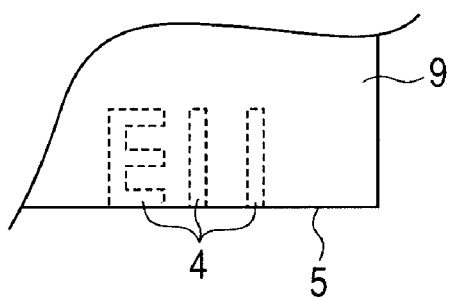
FIG. 3A
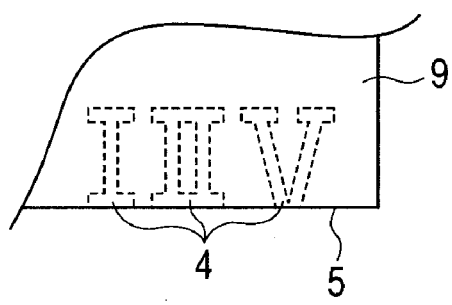
FIG. 3B
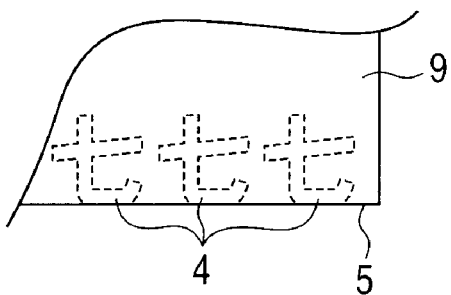
FIG. 3C
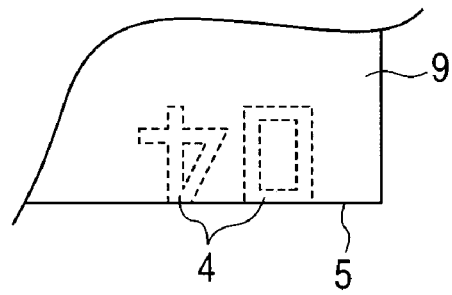
FIG. 3D

LIQUID DISCHARGE HEAD AND METHOD FOR MANUFACTURING THE SAME

BACKGROUND OF THE INVENTION

1. Field of the Invention

The present invention relates to a method for manufacturing a liquid discharge head for discharging liquid, and specifically, to a method for manufacturing an ink jet recording head for recording on a recording medium by discharging ink thereon.

2. Description of the Related Art

For example, liquid discharge heads for discharging liquid are applied to the ink jet recording method in which ink is discharged onto a recording medium for recording thereon. In general, the ink jet recording head includes a flow path, a discharge energy generating element provided in a part of the flow path, and a fine discharge port for discharging ink by energy generated in the element.

A method for manufacturing a liquid discharge head applicable to the ink jet recording head described above by photolithography as employed in the semiconductor manufacturing technology is disclosed in Japanese Patent Application Laid-Open No. 2006-82329. According to this method, a member is formed on one silicon wafer, the member including an element for generating energy to be used for discharging liquid, a discharge port associated therewith, and a flow path. After that, the silicon wafer is separated into a plurality of chip units by dicing, thereby providing discrete recording heads.

On the other hand, a method for marking history information on each of the chip units on the wafer before being diced is disclosed in Japanese Patent Application Laid-Open No. H05-74748. According to this method, a polysilicon fuse element region dedicated to storing history information is provided within the semiconductor chip, and then damaged by a marking laser device, thereby marking the history information. As marked contents, the information on the position of the chips within the wafer, the lot number of the wafer, the wafer serial number, and the like are disclosed.

However, in manufacturing the ink jet recording head, when considering the recording and using the history information during manufacturing, concerns as described below are raised about employing the method disclosed in Japanese Patent Application Laid-Open No. H05-74748.

During the use of the ink jet recording head, it is expected that the surface of the head of chip unit may have ink with some polarity adhered thereto or may contact with recording sheets. To ensure that the history information is maintained for a long time while the chip experiences such events, it is required for the history information recording pattern to have reliability related characteristics such as solvent resistance, abrasion resistance, and the like. Further, it is conceivable to provide an additional member for protecting the history information recording pattern. However, it is difficult to select the material of the protective member by taking into account the recognizability of the history information pattern, more specifically, the effects of the material on legibility such as viewability and the like, the property of intimate contact between the history information pattern and the protective member, and the reliability of the protective member.

SUMMARY OF THE INVENTION

It is therefore an object of the present invention to provide a liquid discharge head having history information which can be maintained for a long time and ensures recognizability. It is another object of the invention to provide a liquid discharge head manufacturing method which allows manufacturing of such a liquid discharge head in a simplified manner with reduced process load text.

A liquid discharge head of the present invention comprises a substrate and a flow path wall member provided on the substrate and having a wall of a flow path communicated with a discharge port for discharging liquid, wherein said flow path wall member is provided with a cavity not communicated with said flow path, when viewed in a direction from said discharge port toward said substrate, said cavity has a shape of a character, and said character corresponds to information regarding said liquid discharge head.

According to an example of the present invention, it is possible to provide a liquid discharge head having history information which ensures recognizability and can be maintained for a long time. This makes it possible to recognize the status of the liquid discharge head in the manufacturing process based on its history information even when the liquid discharge head has been used or stored for a long time after being manufactured. It is also possible to manufacture such a liquid discharge head in a simplified manner with reduced process load.

Further features of the present invention will become apparent from the following description of exemplary embodiments with reference to the attached drawings.

BRIEF DESCRIPTION OF THE DRAWINGS

FIG. 2 is a schematic explanatory view illustrating one example of a liquid discharge head of the present invention.

FIGS. 3A, 3B, 3C, 3D, 3E, 3F, 3G and 3H are schematic explanatory views illustrating one example of the liquid discharge head of the present invention.

DESCRIPTION OF THE EMBODIMENTS

Preferred embodiments of the present invention will now be described in detail in accordance with the accompanying drawings.

Now, the present invention is described with reference to the drawings.

Note that the liquid discharge head can be incorporated into apparatuses such as printers, copiers, facsimile machines having communication systems, word processors having printer portions, and the like and further industrial recording apparatuses combined with various types of processing devices. For example, the head can be used to manufacture biochips, print electric circuits, discharge chemicals in sprayed manner, or the like.

Now, the embodiments of the present invention are described below with reference to the drawings.

Figure 1A:
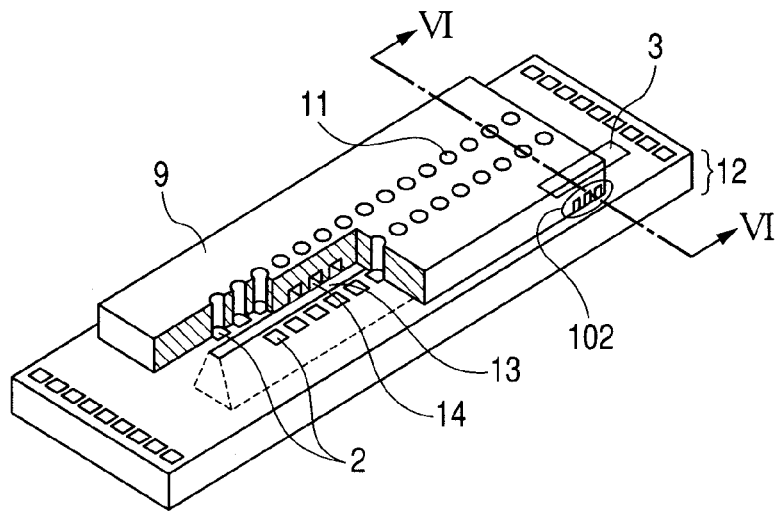
FIGS. 1A and 1B are schematic perspective views illustrating one example of a method for manufacturing a liquid discharge head according to the present invention.
Figure 1B:
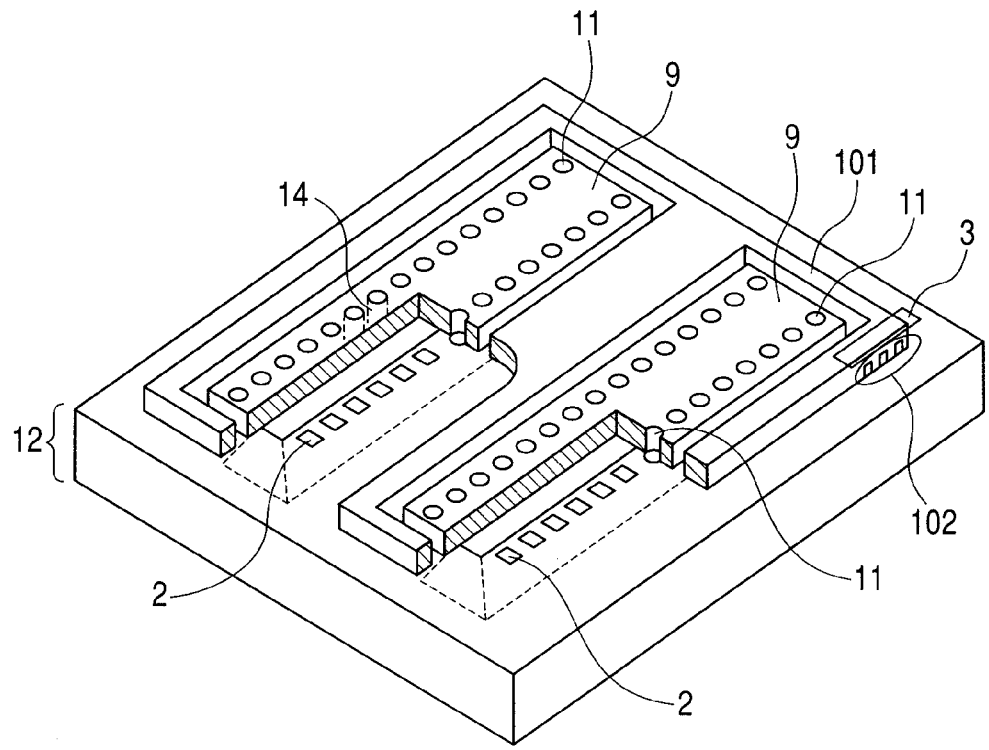

FIGS. 1A and 1B are schematic perspective views illustrating a liquid discharge head. The drawings show the head in a state after being cut into a chip unit. The liquid discharge head of the present embodiment includes a silicon substrate 12 on which energy generating elements 2 for generating energy to be used for discharging ink are arranged in two rows at the predetermined pitch. The substrate 12 is provided with a common supply port 13 opened between the two rows of the energy generating elements 2. In a flow path wall member 9 on the substrate 12, a discharge port 11 opened above each of the energy generating elements 2 and a flow path 14 communicated with each discharge port 11 from the common supply port 13 are provided.

This head is disposed so that the surface with the common supply port 13 formed opposes the recording surface of a recording medium. Recording is performed in such a manner that the ink filled in the flow path via the common supply port 13 is subjected to the pressure generated by the energy generating elements 2 thereby allowing a liquid droplet such as of ink and the like to be discharged from the discharge port 11 and adhered to the recording medium such as paper and the like.

Further, in the configuration shown in FIG. 1B, a peripheral member 101 is disposed so as to surround the periphery of the flow path wall member 9. If the flow path wall member 9 is made of a cured article of resin, then the peripheral member 101 is preferably formed of the same cured article. The provision of the peripheral member 101 flush with the flow path wall member improves, e.g., the wiping characteristics, the protective effects on the elemental surface of the substrate, or the like.

(First Embodiment)

FIG. 2 is a top plan view of a head according to a first embodiment of the present invention.

Figure 5:
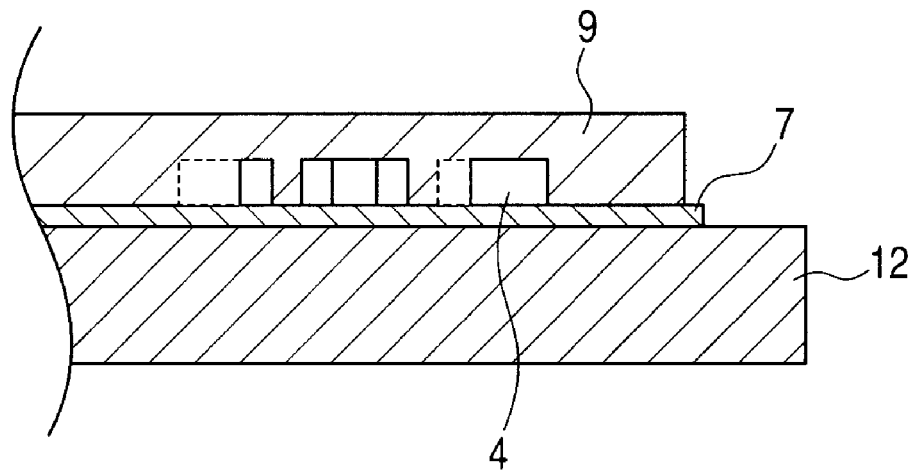
FIG. 5 is a schematic cross-sectional view illustrating one example of the liquid discharge head of the present invention.

FIG. 2 is an enlarged top plan view of the information mark region 3 in FIGS. 1A and 1B, and FIGS. 3A to 3H are enlarged views similar to FIG. 2. The film structure on the substrate 12 is described with reference to FIG. 5. FIG. 5 is a cross-sectional view taken along the line V-V of FIG. 2. As shown in FIGS. 2, 3A to 3H, and 5, a character-shaped cavity 4 in the flow path wall member allows information to be disposed in the shape of a character reaching an end of the flow path wall member 9, i.e., an outer side face 5 of the flow path wall member. When the cavities 4 are viewed in a direction from a side of face provided with the discharge port 11 of flow path wall member 9 toward the substrate 12, the cavities 4 are seen like a character. The portion of the cavities 4 seen like a character is a portion between a ceiling portion facing toward the substrate 12 of flow path wall member 9 and the substrate 12. The flow path wall member 9 has an inner wall surface for forming the cavity 4, and the flow path wall member 9 and the substrate 12 are joined together so that the inner wall surface faces inwardly to form the cavity 4. Of course, the invention is not limited to this configuration; the side surface can also be closed. Further, to enhance the property of intimate contact between the flow path wall member 9 and the substrate 12, there is provided an intimate contact enhancement layer 7 that is made of polyether amide on the surface of the substrate. In the present embodiment, the intimate contact enhancement layer 7 is disposed under the entire flow path wall member of the information mark region 3. The cavity 4 may be communicated with outside atmosphere or isolated from outside atmosphere by the flow path wall member 9. The flow path wall member 9 is provided between the cavity 4 and the flow path 14, whereas the cavity 4 and the flow path 14 are separated from each other by the flow path wall member 9, thereby preventing liquid in the flow path from coming into the cavity. The character-shaped cavity 4 may also be provided in the peripheral member 101. In this case, the peripheral member 101 with an inner wall surface forming the cavity 4 is joined to the substrate 12 so that the inner wall surface faces inwardly to form the cavity 4. The character-shaped cavity may also be provided in either the flow path wall member 9 or the peripheral member 101 or both the flow path wall member 9 and the peripheral member 101.

Figure 3E:
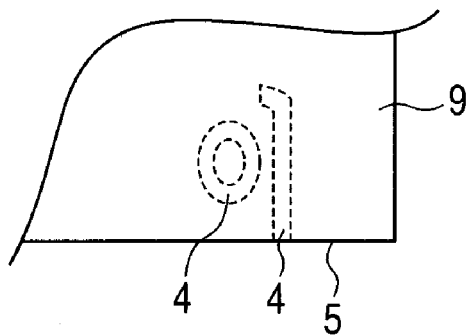
Figure 3F:
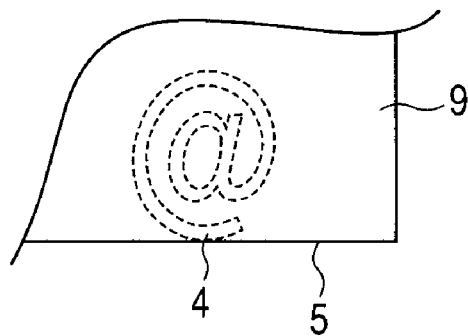
Figure 3G:
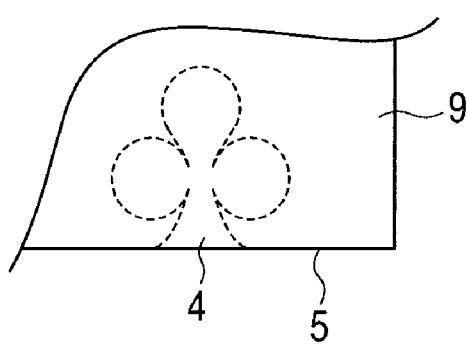

In the enlarged view of FIG. 2, a plurality of individually independent cavities 4 (not communicated with each other) have numerical shapes "7", "0", and "3", respectively, and are indicated as a three-digit number "703". The number of cavities 4 can be used as the number of digits indicating a multiple-digit numerical character. Of course, the cavities can be communicated with each other. Furthermore, as shown in FIGS. 3A to 3D, the character is not limited to numerical characters; as shown in FIG. 3A, three cavities 4 may also be employed to provide a mixture of numerals and Roman letters as "E", "1", and "1" or only Roman letters. Furthermore, numerical characters are not limited to Arabic numerals; Greek numerals (FIG. 3B), Chinese numerals (FIG. 3C), and in addition, what are used as characters in countries such as Hangul alphabets, Cyrillic alphabets, and the like are also acceptable. Furthermore, as shown in FIG. 3D, the numerical characters may also be formed so that they read "0" and "4" with the outer side face 5 placed on top. Further, as shown in FIG. 3E, the cavities 4 may be formed in such a shape that a plurality of cavities 4 are recognizable as the numerical character meaning "2" in the Korean language.

For reading, characters, an operator may visually identify the character(s) using a microscope by providing control to its magnification and focus, or alternatively a machine can identify the character(s). The visual identification by an operator is preferable in that no special reading device is required and even some errors in the shape of characters can be overcome in identifying the characters. On the other hand, it is also possible to employ a device and to recognize the numeral(s) from the information obtained by the device which is capable of obtaining information regarding the shape by measuring the contrast between the flow path wall member 9 and the cavity 4 using light other than the visible light. In this case, the flow path wall member 9 desirably has such light absorption and reflection characteristics that do not hinder measurements with light at an arbitrary wavelength used for measurements.

Figure 4:
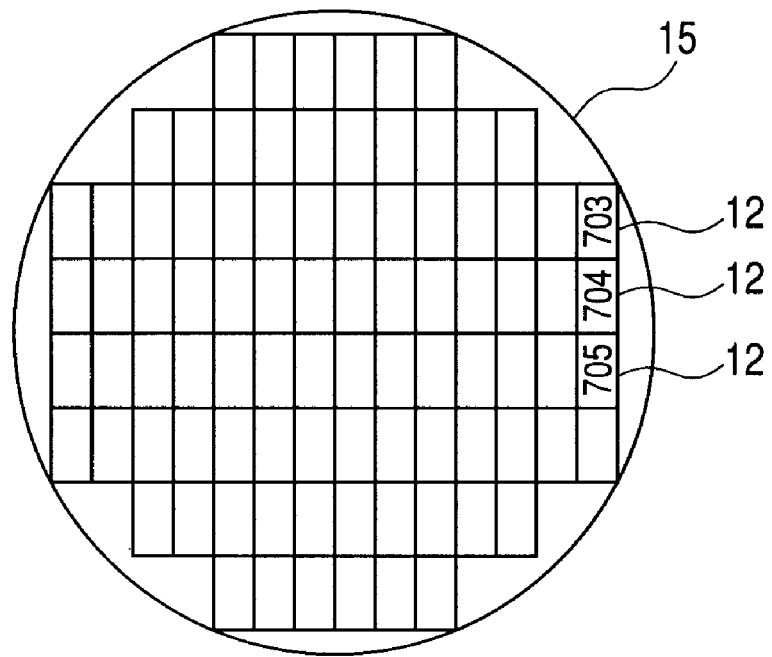
FIG. 4 is a schematic explanatory view illustrating one example of the liquid discharge head of the present invention.

The information imparted as character information by the cavity 4 to the information mark region 3 corresponds to those items concerned with the liquid discharge head. Those items are predetermined before the flow path wall member is provided, i.e., the flow path wall member provided with a space serving as the flow path is formed on the wafer. By way of example, the items include history information. For example, as shown in FIG. 4, the character expressed by the cavity may show a numeral to indicate where the substrate 12 was located in the wafer 15 before it was cut from the wafer into chip units. The item regarding which position in the wafer the respective flow path wall members are formed is predetermined before the flow path wall member is formed, so that the aforementioned item is stored in the form of character(s) as the information regarding the liquid discharge head. By reading the information from a discrete liquid discharge head, the position of the substrate 12 in the wafer after separation can be known. This makes it possible to review and improve the manufacturing process based on the information. For example, one can review the condition of the photomask when the flow path wall member 9 is exposed to light to be manufactured. The information regarding the liquid discharge head may include information for identifying each discrete liquid discharge head, identification information about the exposure mask for forming the flow path wall member, information regarding the date and time and the location of manufacturing, information regarding the number of products to be produced, and the like. The aforementioned information is determined at the time of forming the flow path wall member, so that this information can be displayed in the character(s) of the cavity 4 having the shape(s) corresponding to the information.

Figure 3H:
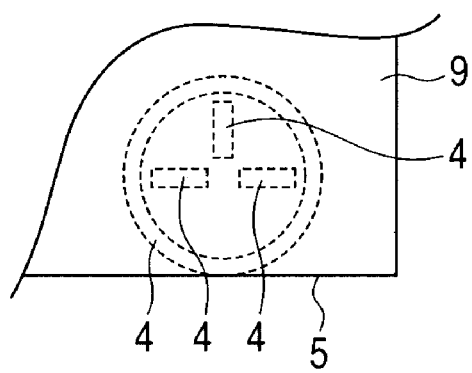

In the above description, the configuration that information corresponding to the information regarding the liquid discharge head is imparted as a character to the liquid discharge head by the cavity 4 having a character shape is explained. However, the shape of the cavity 4 is not limited to the character shape. The cavity shape may be formed in a recognizable shape as a mark in general and the mark may be made corresponding to the information (history information and the like) regarding the liquid discharge head. For example, the cavity may be formed in a shape of mark (FIG. 3F) having a form of "at sign" of keyboard and a mark (FIG. 3G) having a form of "clover". The liquid discharge head may be provided with the cavity 4 having a shape of mark, similar to the shape of character as described above, which is made corresponding to the information known in advance regarding the liquid discharge head. The mark is used in the field of architecture, accounting, road traffic, commerce, and the like, other than in the scholarly field of mathematics, physics, and the like, and in the art field of music, fine arts, and the like. As the mark, for instance, what is used as a code other than a character is exemplified. Further, even a shape which is not generally used and recognized as a mark associated with a matter may be used as a mark by defining the relation between the shape of the mark and information associated with the liquid discharge head. For instance, as shown in FIG. 3H, a shape of circle in which three rectangles are arranged is exemplified. Similarly to the way that the character is made corresponding to the information regarding the liquid discharge head as described above, a plurality of marks may be also made corresponding to a single piece of information.

The cavity 4, which generally has a height equivalent to a height of the flow path 14 from the substrate, is disposed on the substrate 12 side of the flow path wall member 9, and specifically 5 μm or higher and 20 μm or less. From the viewpoint of enhancing the recognizability such as visual identification and the like in observation from the surface in the direction of depth, the cavity 4 may preferably be 10 μm or higher. The flow path wall member 9 is made of a cured article of resin or the like to be generally transparent to the visible light. More specifically, taking into account the visual identification, the member has preferably a transmissivity of 90% or less for light at a wavelength of 550 nm, more preferably 10% or less, and most preferably 1% or less. Specifically, the flow path wall member is formed of an epoxy resin having the oxycyclohexane skeleton such as a cured article of EHPE-3150 (manufactured by Daicel Chemical Industries, Ltd.) and a cured article of novolac-based resin in which SU-8 (manufactured by Kayaku MicroChem Corp.) is known. From the viewpoint of visual identification, it is preferable not to use an additive which has a high absorption coefficient for the visible light.

In the present embodiment, the side faces forming the cavity 4 are at a slight angle to the normal to the surface of the substrate 12. Thus, the faces do not reflect light (not shown in the figures) and thus look black around the cavity when viewed from the flow path wall member surface. The combination of these two features makes it very easy to read numerals and marks corresponding to information.

The history information is provided in the flow path wall member as the hollow pattern as the cavity 4, thereby eliminating the need for a special member dedicated to displaying of history information, a protective member dedicated to history information, or the like. The flow path wall member is made of a material which is selected on the precondition that the member is kept in contact with a discharged liquid such as ink and the like for a long time and possibly brought into contact with recording medium or the like. For these reasons, the history display portion also has the same liquid resistance as that of the flow path wall member and resistance to external impacts, thereby allowing the history information to be maintained for a long time.

(Second Embodiment)

An example of a method for manufacturing a liquid discharge head is described as a second embodiment.

FIGS. 6A to 6G, taken along the line VI-VI of FIG. 1A including region 102, are schematic cross-sectional views illustrating one example of the method for manufacturing a liquid discharge head of the present invention.

Figure 6A:
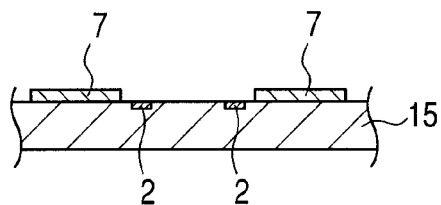
FIGS. 6A, 6B, 6C, 6D, 6E, 6F and 6G are schematic cross-sectional views illustrating one example of a method for manufacturing a liquid discharge head of the present invention.

A silicon-wafer-shaped substrate 15 shown in FIG. 6A has a crystal orientation <100> plane. The <100> plane is employed in the example; however, the present invention is not limited to this orientation. On the substrate 15, disposed are a plurality of energy generating elements 2, such as heat-generating resistors and the like, for generating energy to be used to discharge liquid. Although not illustrated in the drawings, the intimate contact enhancement layer 7 is patterned in a predetermined shape on the substrate 15. The intimate contact enhancement layer 7 is made of a polyether amide resin. More specifically, the layer 7 may be made of HIMAL-1200 (product name) by Hitachi Chemical Co., Ltd. The intimate contact enhancement layer 7 has a thickness of 2 μm.

Figure 6E:
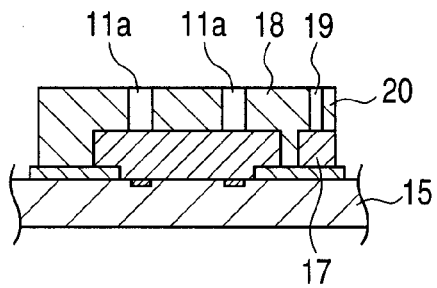
Figure 6B:
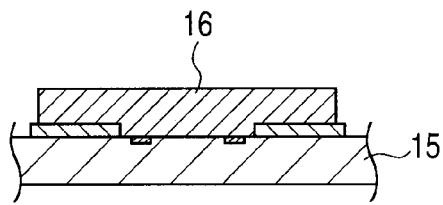

Then, as shown in FIG. 6B, there is provided a resin layer 16 composed of a positive photosensitive resin or the like on the substrate. The resin can be a polyketone-based resin or a methacrylate-based resin. The resin layer 16 has a height of 12 μm.

Figure 6F:
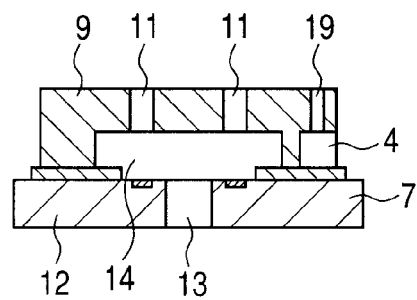
Figure 6C:
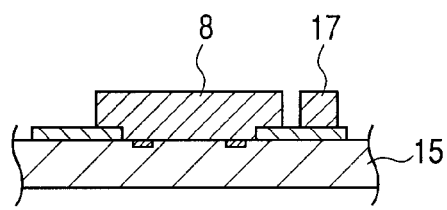
Figure 7:
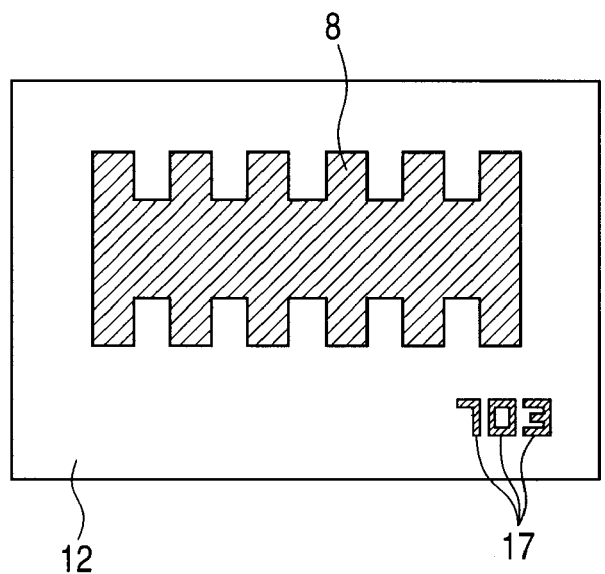
FIG. 7 is a schematic view illustrating a liquid discharge head in a state of its manufacturing steps according to the present invention.

As shown in FIG. 6C, a first mold 8 in the shape of said flow path and a second mold 17 for forming said cavity 4 are separately formed from the resin layer 16. When viewed from above the substrate toward the surface of the substrate (FIG. 7), the second mold 17 has the shape of a character corresponding to the shape of the cavity 4 to be formed. The layer 16 of the positive photosensitive resin is collectively subjected to proximity exposure to light over the entire surface of the wafer so that the first mold 8 can yield the same shape and the second mold 17 can provide a different character shape for each of the chip units. The character shows the position of each chip unit in the wafer. This is made possible by editing the exposure mask. The subsequent development allows the mold to be formed. The mold is plural in number corresponding to the number of liquid discharge heads to be manufactured by cutting the wafer.

Figure 6G:
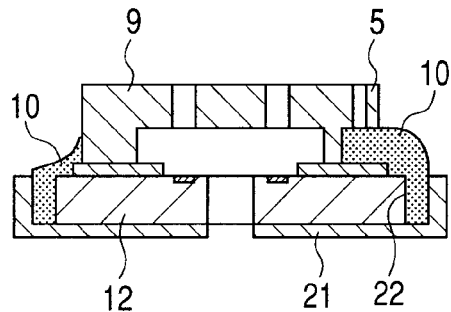
Figure 6D:
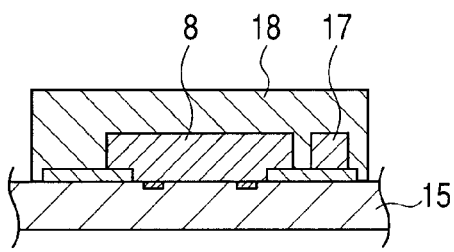

Then, as shown in FIG. 6D, a coating layer 18 which is made of a negative photosensitive resin such as a photosensitive epoxy resin and the like and serves as the flow path wall member, is provided on the substrate so as to cover the first mold 8 and the second mold 17. The coating layer 18 can be coated by spin coating or the like.

Then, as shown in FIG. 6E, the coating layer 18 is optically processed, i.e., exposed to light, developed, and the like, thereby forming a first opening 11a serving as a discharge port and a second opening 19 for removing the second mold to form the cavity. The first opening 11a is formed on the first mold and the second opening 19 is formed on the second mold. Together therewith, the second mold 17 is exposed by forming an outer side face 20 in the coating layer 18. The light exposure and development are performed so that flow path wall members are formed in plurality corresponding to the number of liquid discharge heads which are to be formed by being cut from the wafer.

Figure 8:
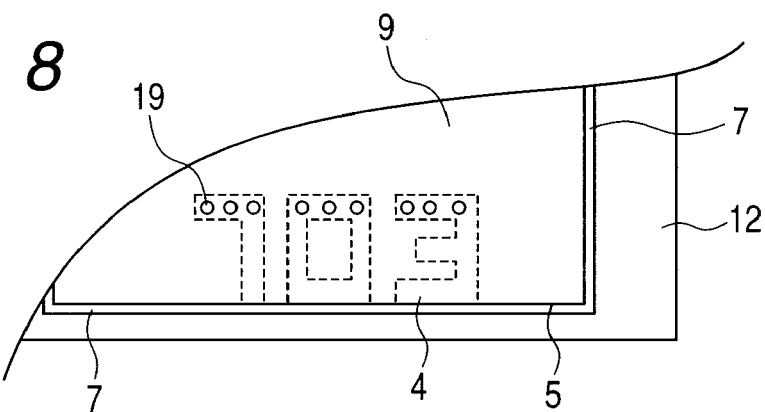
FIG. 8 is a schematic explanatory view illustrating one example of the liquid discharge head of the present invention.

Then, as shown in FIG. 6F, a supply port 13 is formed in the substrate 15, and the first mold and the second mold are collectively removed by dissolution, ultrasound, or the like. Thus, the flow path 14, the discharge port 11, and the flow path wall member 9 are formed. The character-shaped cavities 4 are also collectively formed together with the flow path. FIG. 8 shows the cavities when viewed from above the substrate. The cavity 4 are opened on the outer side face 5 side of the flow path wall member 9 and on the side in which the discharge port 11 is provided by the second opening 19. Subsequently, the wafer-shaped substrate 15 is cut by dicing or the like to be divided into one or a predetermined number of flow path wall members as a unit, thereby allowing a liquid discharge head to be manufactured with a flow path wall member and the like provided on the substrate 12 as a chip unit.

Further, the implementation steps that subsequently follow are explained.

Figure 9:
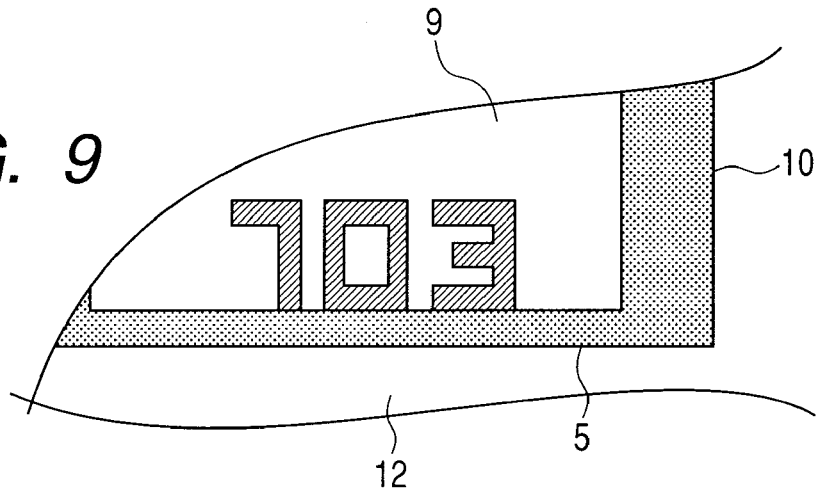
FIG. 9 is a schematic explanatory view illustrating one example of the liquid discharge head of the present invention.

As shown in FIG. 6G, the liquid discharge head is placed on a supporting member 21 made of alumina or the like to join the substrate 12 and the supporting member 21 together by an adhesive or the like. Then, an end face 22 of the substrate 12 which is made by die cutting is sealed with a seal member 10. The sealing is performed by a sealing material such as a butadiene-based epoxy and the like to protect the end face against a mist or the like of discharged liquid such as ink mist and the like. More specifically, a product of the seal material may be NR 200C (product name) manufactured by Sanyu Rec Co., Ltd. In that process, the seal member 10 is injected by capillarity from the outer side face 5 of the flow path wall member 9 into the cavity 4. FIG. 9 is a top plan view of a history information display portion when viewed from above the substrate. As illustrated, if the seal member 10 allows the character to be transparent from the outer side face 5 to the inside of the flow path wall member 9, a black seal member 10 can be injected to further enhance the contrast, thereby ensuring greater ease in reading the history information.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-194455, filed Aug. 25, 2009, which is hereby incorporated by reference herein in its entirety.

What is claimed is:

1. A liquid discharge head comprising:
   a substrate; and
   a flow path wall member provided on said substrate and having a wall forming a flow path connected to a discharge port for discharging liquid,
   wherein said flow path wall member is provided with a cavity or a plurality of cavities not connected to the flow path,
   when viewed in a direction from the discharge port toward said substrate, said cavity or plurality of cavities are covered by said flow path wall member and have a shape of a character, which is visible or optically detectable through a portion of said flow path wall member, and
   the character or a plurality of said characters correspond to information regarding said liquid discharge head.

2. A liquid discharge head according to claim 1, wherein the character is a numerical character.

3. A liquid discharge head according to claim 2, wherein the numerical character is one selected from an Arabic numeral, a Chinese numeral, and a Greek numeral.

4. A liquid discharge head according to claim 1, wherein the cavity is provided in plurality in said flow path wall member, and
   when viewed in the direction from the discharge port toward said substrate, the plurality of cavities each having a shape of a numerical character indicate a multiple-digit numerical character.

5. A liquid discharge head according to claim 1, wherein said liquid discharge head is manufactured by providing said flow path wall member in plurality on a wafer substrate and then dividing the wafer substrate into plural numbers with a predetermined number of said flow path wall members as one unit, and
   the information concerns a position of said flow path wall member within a region of the wafer substrate.

6. A liquid discharge head according to claim 1, wherein said flow path wall member has an inner wall surface for forming the cavity or the plurality of cavities, and
   said flow path wall member and said substrate are joined together so that the inner wall surface faces inwardly, to form the cavity or the plurality of cavities.

7. A liquid discharge head according to claim 1, wherein said flow path wall member includes a cured article of epoxy resin.

8. A liquid discharge head comprising:
   a substrate; and
   a flow path wall member provided on said substrate and having a wall forming a flow path connected to a discharge port for discharging liquid,
   wherein a seal member sealing an end face of said substrate and provided in contact with an outer side face of said flow path wall member is provided from the outer side face to an inside of said flow path wall member,
   when viewed in a direction from the discharge port toward said substrate, said seal member within said flow path wall member has a shape of a character, which is visible or optically detectable through a portion of said flow path wall member, and
   the character corresponds to information regarding said liquid discharge head.

9. A liquid discharge head comprising:
   a substrate;
   a flow path wall member provided on said substrate and having a wall forming a flow path connected to a discharge port for discharging liquid; and
   a peripheral member for surrounding said flow path wall member, wherein said peripheral member is provided with a cavity or a plurality of cavities not connected to the flow path, when viewed in a direction from the discharge port toward said substrate, the cavity or the plurality of cavities is covered by said peripheral member and has a shape of a character or a plurality of characters, which is visible or optically detectable through a portion of said peripheral member, and the character or the plurality of characters corresponds to information regarding said liquid discharge head.

10. A liquid discharge head according to claim 9, wherein the character is one selected from an Arabic numeral, a Chinese numeral, and a Greek numeral.

11. A liquid discharge head according to claim 9, wherein said peripheral member has an inner wall surface for forming the cavity or the plurality of cavities, and said peripheral member and said substrate are joined together so that the inner wall surface faces inwardly, to form the cavity or the plurality of cavities.

12. A liquid discharge head comprising:

a substrate; and a flow path wall member provided on said substrate and having a wall forming a flow path connected to a discharge port for discharging liquid, wherein said flow path wall member is provided with a plurality of cavities not connected to the flow path, when viewed in a direction from the discharge port toward said substrate, the plurality of cavities is covered by said flow path wall member and is shaped such that a shape of a single character is recognizable by the plurality of cavities and is visible or optically detectable through a portion of said flow path wall member, and the single character corresponds to information regarding said liquid discharge head.

13. A liquid discharge head comprising:

a substrate; and a flow path wall member provided on said substrate and having a wall forming a flow path connected to a discharge port for discharging liquid, wherein said flow path wall member is provided with a plurality of cavities not connected to the flow path, when viewed in a direction from the discharge port toward said substrate, the plurality of cavities is covered by said flow path wall member and is shaped such that a mark is recognizable by the plurality of cavities and is visible or optically detectable through a portion of said flow path wall member, and the mark corresponds to information regarding said liquid discharge head.

* * * * *